United States Patent [19]

Bouzidi

[11] Patent Number: 5,150,071
[45] Date of Patent: Sep. 22, 1992

[54] DIFFERENTIAL OUTPUT STAGE FOR ELECTRONIC EQUIPMENT

[75] Inventor: Jean-Pierre Bouzidi, Lannion, France

[73] Assignee: Alcatel Cit, Paris, France

[21] Appl. No.: 672,799

[22] Filed: Mar. 21, 1991

[30] Foreign Application Priority Data

Mar. 29, 1990 [FR] France ............... 90 04032

[51] Int. Cl.⁵ .................................. H03F 3/68
[52] U.S. Cl. .................................. 330/84; 330/295; 330/124 R; 330/85
[58] Field of Search .............. 330/84, 85, 960, 295, 330/69, 124 R

[56] References Cited

U.S. PATENT DOCUMENTS

| | | | |
|---|---|---|---|
| 3,516,006 | 6/1970 | Donjon | 330/84 |
| 3,566,298 | 2/1971 | Stevens | 330/84 |
| 3,990,020 | 11/1976 | Porter, III | 330/207 P |
| 4,047,122 | 9/1977 | Rao | 330/84 |
| 4,242,741 | 12/1980 | Parrish | 330/84 |

FOREIGN PATENT DOCUMENTS

| | | | |
|---|---|---|---|
| 2458948 | 1/1981 | France . | |
| 58-121808 | 7/1983 | Japan | 330/84 |
| 2010039 | 6/1979 | United Kingdom . | |

Primary Examiner—Eugene R. LaRoche
Assistant Examiner—Tan Dinh
Attorney, Agent, or Firm—Sughrue, Mion, Zinn, Macpeak & Seas

[57] ABSTRACT

A differential output stage for electronic equipment, the output stage comprising a two-port network having two paths, each connecting an input terminal to an output terminal, and comprising means for generating a negative feedback voltage from each path for application to the other, and means for providing an output voltage in each path equal to an identical linear combination in each path, of the input voltage to the path and of the negative feedback voltage from the other path.

6 Claims, 3 Drawing Sheets

DIFFERENTIAL OUTPUT STAGE FOR ELECTRONIC EQUIPMENT

The present invention relates to electronic equipment, and it relates more particularly to a differential output stage for such equipment.

BACKGROUND OF THE INVENTION

A differential output stage for electronic equipment generally includes a transformer enabling a differential output voltage to be obtained which is independent of connection conditions to the output terminals of the equipment.

The main problem posed by such a transformer, particularly in audiofrequency equipment, is its size, with this problem being aggravated by the fact that its characteristics concerning pass band, variation in output level with load, and harmonic distortion all improve with increasing bulk.

Differential output stages for electronic equipment, and in particular audiofrequency equipment, are also known which do not include transformers. Unlike those including transformers, they are compact, but they suffer from the drawback that the output level depends on the connection made. For example, if one of the output terminals is grounded, then since each of the output terminals contributes one-half to the differential output voltage, the differential output voltage is divided by two.

An object of the present invention is to provide a differential output stage for electronic equipment which does not include a transformer but which nevertheless makes it possible to obtain the same differential output voltage regardless of the connection conditions to the output terminals: terminal connected to ground, terminals open circuit, terminals loaded.

Another object of the present invention is to provide a differential output stage for audiofrequency electronic equipment making it possible, in the event of an output terminal being grounded, to avoid possible distortion in the differential output voltage.

SUMMARY OF THE INVENTION

The present invention provides a differential output stage for electronic equipment, the output stage comprising a two-port network having two paths each connecting an input terminal to an output terminal, wherein the stage comprises means for generating a negative feedback voltage from each path for application to the other path, and means for providing an output voltage in each path equal to an identical linear combination in each path, of the input voltage to the path and of the negative feedback voltage from each path.

BRIEF DESCRIPTION OF THE DRAWINGS

Embodiments of the invention are described by way of example with reference to the accompanying drawings, in which.

DETAILED DESCRIPTION

Figure 1:
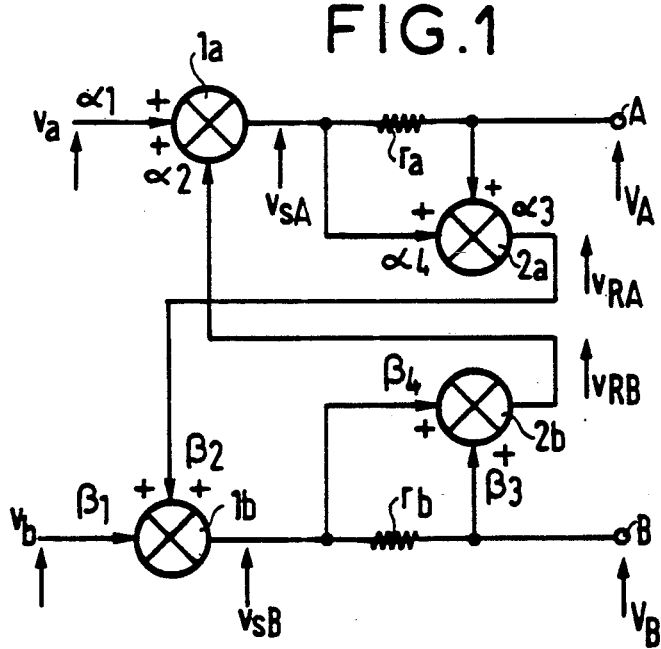
FIG. 1 is a theoretical diagram of a first embodiment of a differential output stage of the invention.

The differential stage shown in FIG. 1 is constituted in the form of a two-port network having output terminals referenced A and B with the differential output voltage being equal to $V_A - V_B$, where $V_A$ designates the voltage at point A, and $V_B$ designates the voltage at point B. The input terminals of this two-port network are referenced a and b with $v_a$ and $v_b$ respectively designating the voltages at these points.

On its path a-A connecting its terminal a to its terminal A, this two-port network comprises a summing circuit 1a having two inputs with respective weighting coefficients $\alpha_1$ and $\alpha_2$, and providing an output voltage $v_{sA}$ equal to a linear combination of its input voltages such that:

$$v_{sA} = \alpha_1 v_a + \alpha_2 v_{RB} \tag{1}$$

where $v_{RB}$ represents a negative feedback voltage from the path b-B to the path a-A, and is obtained at the output from a summing circuit 2b having two inputs with respective weighting coefficients $\beta_3$ and $\beta_4$, providing an output voltage equal to a linear combination of its input voltages, such that:

$$v_{RB} = \beta_3 V_B + \beta_4 v_{sB} \tag{2}$$

in which the voltage $v_{sB}$ is the voltage obtained at the output of a summing circuit 1b, having two inputs with respective weighting coefficients $\beta_1$ and $\beta_2$ and connected in the path b-B in a manner analogous to the summing circuit 1a in the path a-A, and providing an output voltage $v_{sB}$ equal to a linear combination of its input voltages, such that:

$$v_{sB} = \beta_1 v_b + \beta_2 v_{RA} \tag{3}$$

in which $v_{RA}$ is a negative feedback voltage from the path a-A to the path b-B and is obtained at the output of a summing circuit 2a having two inputs with respective weighting coefficients $\alpha_3$ and $\alpha_4$, providing an output voltage equal to a linear combination of its input voltages such that:

$$v_{RA} = \alpha_3 V_A + \alpha_4 v_{sA} \tag{4}$$

A resistance $r_a$ is disposed on the path a-A between the input to the summing circuit 2a having the coefficient $\alpha_3$ and the point common to the output of the summing circuit 1a and to the input of summing circuit 2a having the coefficient $\alpha_4$.

A resistance $r_b$ is similarly disposed in the path b-B between the input to the summing circuit 2b having the coefficient $\beta_3$ and the point common to the output of the summing circuit 1b and to the input of the summing circuit 2b having the coefficient $\beta_4$.

The following equations can be derived from equations (1), (2), (3), and (4):

$$\alpha_3 V_A = -\alpha_1 \alpha_4 v_a - \alpha_2 \alpha_4 v_{RB} + V_{RA}$$

$$\beta_3 V_B = -\beta_1 \beta_4 v_b - \beta_2 \beta_4 v_{RA} + V_{RB}$$

and by subtraction $$\alpha_3 V_A - \beta_3 V_B = -\alpha_1 \alpha_4 v_a + \beta_1 \beta_4 v_b$$
$$-\alpha_2 \alpha_4 v_{RB} + \beta_2 \beta_4 v_{RA}$$
$$--v_{RB} + v_{RA}$$

Applying the following conditions to the coefficients $\alpha_1$ to $\alpha_4$ and $\beta_1$ to $\beta_4$:

$$\alpha_3 = \beta_3 = \gamma$$

$$\alpha_1\alpha_4/\gamma = \beta_1\beta_4/\gamma = -k$$

$$\alpha_4\alpha_2 = -1$$

$$\beta_4\beta_2 = -1$$

in which $\gamma$ and k are constants that may be positive or negative, the output voltages $V_A$ and $V_B$ of the paths a-A and b-B are then each equal to the same linear combination of the input voltage to that path and of the appropriate negative feedback voltage $v_{RA}$ or $v_{RB}$, and the difference between them is written:

$$V_A - V_B = k(v_a - v_b) \quad (5)$$

This equation shows that for given k the differential output voltage $V_A - V_B$ then depends only on the differential input voltage $v_a - v_b$, and is therefore the same regardless of the connection conditions to the output terminals A and B.

In particular, when output terminal B is connected to ground, then $V_A$ is still equal to $k(v_a - v_b)$, while $V_B$ is equal to 0, and similarly, when output terminal A is connected to ground, then $V_B$ is still equal to $k(v_b - v_a)$, with $V_A$ being equal to 0.

Figure 2:
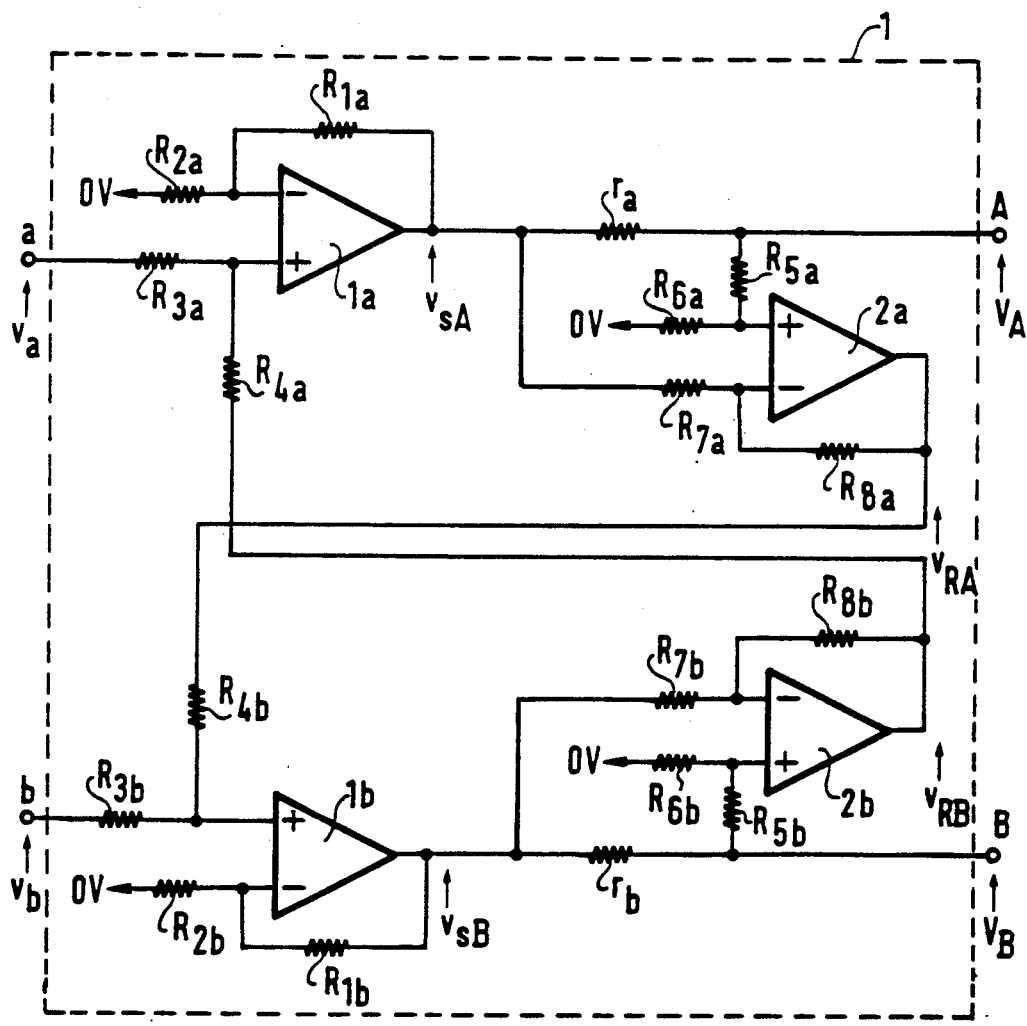
FIG. 2 is a detailed circuit diagram of an example of this first embodiment.

FIG. 2 shows a detailed diagram of the differential output stage shown in FIG. 1 and suitable for implementing the equation $V_A - V_B = k(v_a - v_b)$.

In this embodiment, the summing circuit 1a is a differential amplifier connected as an adder by means of a set of resistors $R_{1a}$, $R_{2a}$, $R_{3a}$, and $R_{4a}$.

Similarly, the summing circuit 1b is likewise a differential amplifier connected as an adder by means of a set of resistors $R_{1b}$, $R_{2b}$, $R_{3b}$, and $R_{4b}$.

The summing circuit 2a is a differential amplifier connected as a subtractor by means of a set of resistors $R_{5a}$, $R_{6a}$, $R_{7a}$, and $R_{8a}$.

Summing circuit 2b is similarly a differential amplifier connected as a subtractor by means of a set of resistors $R_{5b}$, $R_{6b}$, $R_{7b}$, and $R_{8b}$.

More precisely, differential amplifier 1a is connected as follows. Its non-inverting input (referenced "+") receives firstly the input voltage $v_a$ via resistor $R_{3a}$, and secondly the negative feedback voltage $v_{RB}$, via resistor $R_{4a}$. Its inverting input (referenced "−") receives firstly the reference potential, referenced 0V, via resistor $R_{2a}$, and secondly its own output voltage $v_{sA}$, via negative feedback resistor $R_{1a}$.

The differential amplifier 2a is connected as follows. Its non-inverting input receives both the reference potential 0V via resistor $R_{6a}$, and the output voltage $V_A$, via resistor $R_{5a}$. Its negative input receives both the output voltage $v_{sA}$ from the differential amplifier 1a via resistor $R_{7a}$, and its own output voltage via negative feedback resistor $R_{8a}$.

The differential amplifiers 1b and 2b are connected in the same manner as described above for amplifiers 1a and 2a, merely replacing indices a and A by indices b and B. It may be observed that the offset voltages of the amplifiers may be eliminated by connecting capacitors in series with resistors $R_{4a}$ and $R_{4b}$.

The resistance $r_a$ is provided by a resistor connected in the path a-A between the terminals of resistors $R_{5a}$ and $R_{7a}$.

The resistance $r_b$ is similarly provided by a resistor connected in the path b-B between the terminals of resistors $R_{5b}$ and $R_{7b}$.

The resistance values used in this circuit are such that:

$R_{1a} = R_{2a}$ $R_{3a} = R_{4a}$ $R_{5a} = R_{6a}$ $R_{7a} = R_{8a}$ $R_{1b} = R_{2b}$ $R_{3b} = R_{4b}$ $R_{5b} = R_{6b}$ $R_{7b} = R_{8b}$

Under these conditions, equations (1), (2), (3), and (4) are satisfied with:

$$\alpha_1 = \alpha_2 = \alpha_3 = \beta_1 = \beta_2 = \beta_3 = 1, \text{ and } \alpha_4 = \beta_4 = -1,$$

with the output voltages $V_A$ and $V_B$ of the paths a-A and b-B then being written $$V_A = v_a + (v_{RB} + v_{RA})$$

$$V_B = v_b + (v_{RA} + v_{RB})$$

and their difference is written:

$$V_A - V_B = v_a - v_b$$

with the constant k then being equal to 1.

With the circuit shown in FIG. 2, distortion can nevertheless occur in the differential output voltage if one of the output terminals is grounded.

If one of the output terminals (e.g. terminal B) is grounded, then the output of the corresponding amplifier (i.e. amplifier 1b in the example shown) is connected to ground via a very low resistance. With the voltage $v_b$ remaining unchanged, the current drawn $v_{sB}/r_b$ is equal to $(v_b + v_{RA})/r_b$, and this may exceed the maximum current that the amplifier 1b is capable of delivering, which would then limit the voltage $v_{sB}$ delivered thereby so that it is no longer equal to the sum of the voltages $v_b$ and $v_{RA}$, with the result that distortion then appears in the output of the circuit that remains active, i.e. the output A. Under certain circumstances, it is even possible for the amplifier concerned to be damaged.

One solution for overcoming this drawback would be to overdimension the amplifiers 1a and 1b.

Figure 3:
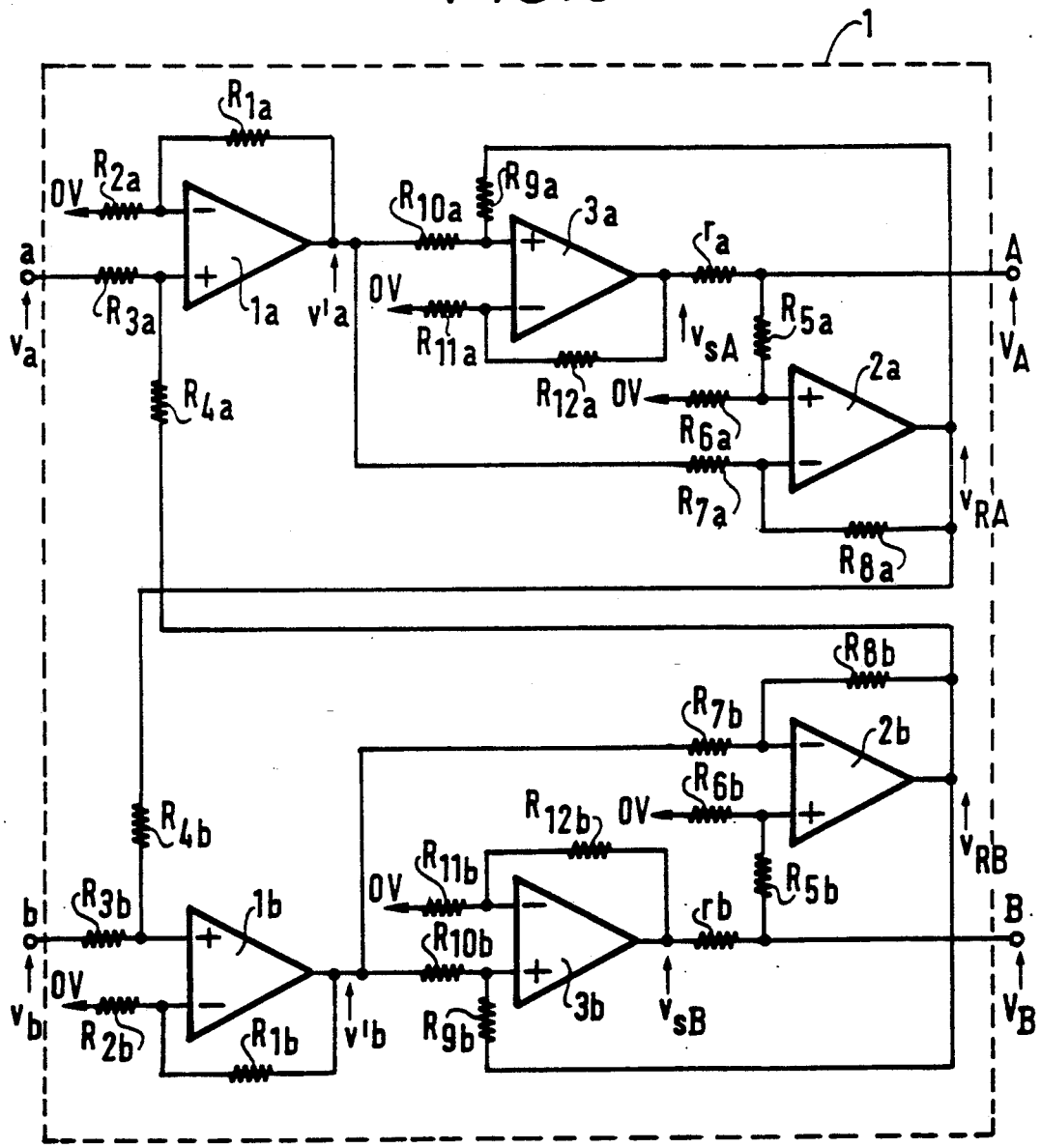
FIG. 3 is a detailed circuit diagram of a second embodiment of a differential output stage of the invention.

A more advantageous solution for avoiding this drawback is provided by the circuit shown in FIG. 3.

In addition to the circuit elements shown in FIG. 2, and given the same references, this circuit includes two further differential amplifiers 3a and 3b inserted in respective ones of the paths a-A and b-B, respectively in series with the resistance $r_a$ between the terminals of resistors $R_{5a}$ and $R_{7a}$, and in series with the resistance $r_b$, between the terminals of resistors $R_{5b}$ and $R_{7b}$.

The differential amplifiers 3a and 3b are connected in such a manner as to tend to deliver a zero output voltage when the corresponding output terminal of the circuit is connected to ground, while avoiding saturating these differential amplifiers.

More precisely, amplifier 3a is connected as follows. Its non-inverting input is connected both to the output of the amplifier 1a via a resistor $R_{10a}$ and to the output of amplifier 2a via a resistor $R_{9a}$. Its inverting input is connected both to the reference potential 0V via a resistor $R_{11a}$, and to its own output via a negative feedback resistor $R_{12a}$.

Amplifier 3b is connected in similar manner to that described above for amplifier 3a, with the indices a being replaced by indices b.

The following equations are then obtained for amplifiers 3a and 3b, with $v_{sA}$ and $v_{sB}$ designating the respective output voltages from the amplifiers 3a and 3b, and with $v'_a$ and $v'_b$ respectively designating the output voltages from the amplifiers 1a and 1b:

$$\frac{v_a'R_{9A} + v_{RA}R_{10a}}{R_{9a} + R_{10a}} = v_{sA}\frac{R_{11a}}{R_{11a} + R_{12a}} \quad (6)$$

$$\frac{v_b'R_{9b} + v_{RB}R_{10b}}{R_{9b} + R_{10b}} = v_{sB}\frac{R_{11b}}{R_{11b} + R_{12b}} \quad (7)$$

Using the following notation:

$$g_a = 1 + R_{12a}/R_{11a}$$

$$x_a = R_{9a}/R_{10a}$$

$$g_b = 1 + R_{12b}/R_{11b}$$

$$x_b = R_{9b}/R_{10b}$$

Then equations (6) and (7) become:

$$v_{sA} = v'_a g_a x_a/(1+x_a) + v_{RA}g_a/(1+x_a) \quad (8)$$

$$v_{sB} = v'_b g_b x_b/(1+x_b) + v_{RB}g_b/(1+x_b) \quad (9)$$

The operating equations of amplifiers 1a and 2a are then written:

$$v_a + v_{RB} = v'_a \quad (10)$$

$$v_a' + v_{RA} = V_A \quad (11)$$

and the operating equations of amplifiers 1b and 2b become:

$$v_b + v_{RA} = v'_b \quad (12)$$

$$v'_b + v_{RB} = V_B \quad (13)$$

As for the circuit of FIG. 2, equations (10) and (11) and equations (12) and (13) again give:

$$V_A = v_a + (v_{RB} + v_{RA})$$

$$V_B = v_b + (v_{RA} + v_{RB})$$

and consequently $$V_A - V_B = v_a - v_b$$

and this is independent of the values of $g_a$, $g_b$, $x_a$, and $x_b$. For reasons of symmetry, it is advantageous to select:

$$g_a = g_b = g$$

$$x_a = x_b = x$$

By substituting $v_{RA}$ and $v_{RB}$ by following expressions:

$$v_{RA} = V_A - (v_a + v_{RB})$$

$$v_{RB} = V_B - (v_b + v_{RA})$$

deduced from equations (10), (11), (12), and (13), and by substituting into equations (8) and (9) the expressions for $v'_a$ and $v'_b$ given by equations (11) and (13), the following equations are obtained:

$$v_{sA} = (v_a + v_{RB})gx/(1+x) + [V_A - (v_a + v_{RB})]g/(1+x) \quad (14)$$

$$v_{sB} = (v_b + v_{RA})gx/(1+x) + [V_B - (v_b + v_{RA})]g/(1+x) \quad (15)$$

Unlike the circuit shown in FIG. 2, in the event of one of the output terminals being grounded, e.g. terminal B, i.e. forcing $V_B = 0$, then the following is obtained: (cf. equation (15) with $V_B = 0$):

$$v_{sB} = (v_b + v_{RA})gx/(1+x) - (v_b + v_{RA})g/(1+x)$$

i.e.

$$v_{sB} = [(v_b + v_{RA})g/(1+x)](x-1)$$

Resistors $R_9$, $R_{10}$, $R_{11}$, and $R_{12}$ are selected so that:

$$x = 1 + \epsilon \text{ with } 0 < \epsilon < < 1$$

$$g \approx 2$$

Under these conditions, the voltage $v_{sB}$ is limited to:

$$v_{sB} = (v_b + v_{RA})\epsilon$$

It can be seen that in this case the current $v_{sB}/r_b$ equal to $(v_b + v_{RA})\epsilon/r_b$ drawn from the amplifier connected to output terminal B via the resistance $r_b$, i.e. in this case the amplifier 3b, is reduced by the factor $\epsilon$ relative to the current drawn in the circuit of FIG. 2. This makes it possible to avoiding saturating the amplifier 3b without it being necessary to overdimension it.

Naturally, an analogous result is obtained for the amplifier 3a, if output terminal A is grounded.

As shown above, the equation:

$$V_A - V_B = v_a - v_b$$

is satisfied independently of the values of $x_a$ and $x_b$ and of $g_a$ and $g_b$. However since the negative feedback voltages $v_{RA}$ and $v_{RB}$ are looped back on themselves, respectively via resistors $R_{9a}$ and $R_{9b}$, as well as being looped back on each other, this circuit runs the risk of being unstable.

The condition for stability is related to the open loop gain of these negative feedback voltages, calculated in the absence of input voltages $v_a$ and $v_b$.

For the circuit to remain stable, the open loop gain T must be such that:

$$|T| < 1$$

Figure 4:
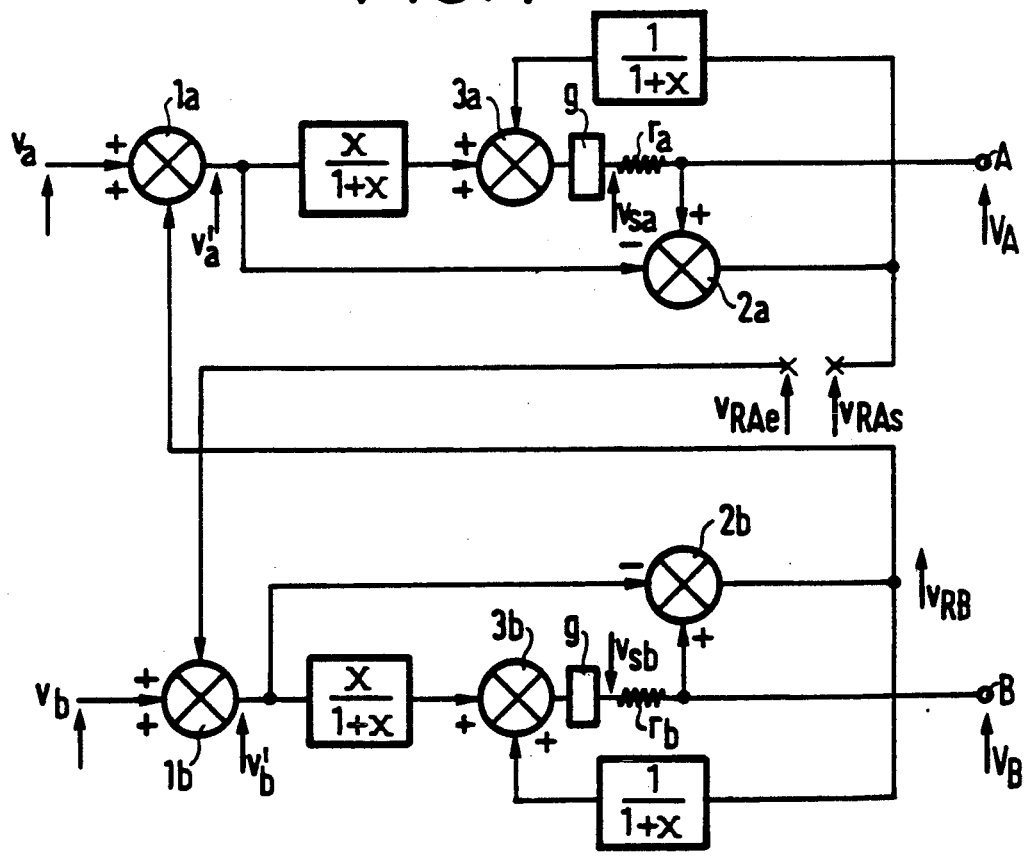
FIG. 4 is a symbolic representation of the differential output stage shown in FIG. 3.

This gain is expressed by the ratio $v_{RAs}/v_{RAe}$ where $v_{RAs}$ is the output negative feedback voltage due to an input negative feedback voltage $v_{RAe}$, as shown in FIG. 4, where the amplifiers 1a, 1b, 2a, 2b, 3a, and 3b are represented symbolically by the summing function they perform and in which the coefficients:

$$x/(1+x) \text{ and } 1/(1+x)$$

are also shown as applied to the inputs of the summing circuits 3a and 3b, as is g applied to their outputs.

The equations describing the circuit are as follows:

$$v_{RAs} = v_{RB} \cdot F$$

$$v_{RB} = v_{RAe} \cdot F$$

i.e. $v_{RAs}/v_{RAe} = F^2$ where F characterizes the function performed by the summing circuits and the coefficients applied to each path.

Writing:

$$\delta = V_A/v_{sA} = V_B/v_{sB} \text{ for } r_a = r_b,$$

it is possible to write:

$$v_{RB} = v_{sB}\delta - v_{RAe}$$

$$v_{sB} = v_{RB}g/(1+x) + v_{RAe}gx/(1+x)$$

From which it can be deduced:

$$F = [g\delta x - (1+x)]/[(1+x) - g\delta]$$

The stability condition is:

$$|v_{RAs}/v_{RAe}| < 1$$

which reduces to:

$$-1 < F < 1$$

There are two possible ways in which this condition can be satisfied:

either $$x > 1 \text{ and } g\delta < 2$$

or else $$x < 1 \text{ and } g\delta > 2$$

The stability of the local loop formed on each path by looping back the output from summing circuit 2a or 2b to one of the inputs of summing circuit 3a and 3b can be studied in analogous manner to that described above for the overall loop in the circuit, thereby obtaining the additional condition:

$$g\delta < 1+x$$

which condition is compatible only with the first of the two preceding possibilities, i.e.

$$x > 1 \text{ (i.e. } R_{9a} > R_{10a} \text{ and } R_{9a} > R_{10b}) \text{ and } g\delta < 2$$

Which for $\delta$ slightly less than 1, gives:

$$R_{12a} \leq R_{11a} \text{ and } R_{12b} \leq R_{11b}$$

Resistance values are selected for the resistors $R_{9a}$, $R_{9b}$, $R_{10a}$, $R_{10b}$, $R_{11a}$, $R_{11b}$, and $R_{12b}$ such that $$R_{9a}/R_{10a} = 1 + \epsilon_a \text{ with } 0 < \epsilon_a << 1$$

$$R_{9b}/R_{10b} = 1 + \epsilon_b \text{ with } 0 < \epsilon_b << 1$$

$$R_{12a}/R_{11a} = 1 - \epsilon'_a \text{ with } 0 \leq \epsilon'_a << 1$$

$$R_{12b}/R_{11b} = 1 - \epsilon'_b \text{ with } 0 \leq \epsilon'_b << 1$$

and also so as to avoid any risk of saturating the amplifiers 1a and 1b. To simplify, we consider the case where $\epsilon_a = \epsilon_b$ and $\epsilon'_a = \epsilon'_b$, i.e.

$$v = v_a = -v_b,$$

e.g. with $v > 0$.

With symmetrical operating conditions for the two paths a-A and b-B, and the function F having the same value for both paths, the voltages $v'_a$ and $v'_b$ may be written:

$$v'_a = v/(1+F)$$

$$v'_n = -v/(1+F)$$

To avoid any risk of the amplifiers 1a and 1b saturating, the voltages $v'_a$ and $v'_b$ must not exceed 2v in absolute value, and, taking account of the stability condition $$-1 < F < 1,$$

this leads to the condition $$-\tfrac{1}{3} \leq F < 1$$

When one of the output terminals, e.g. terminal B, is grounded, then the function F relating to part B is equal to $-1$, since the ratio $V_B/v_{sB}$ is zero, and the value of the function F relating to the part A is close to that of the preceding case. The voltages $v'_a$ and $v'_b$ are then expressed by:

$$v'_a = 2v/(1+F)$$

$$v'_b = -v(1-F)/(1+F)$$

The condition that the voltages $v'_a$ and $v'_b$ and must not exceed 2v in absolute value, requires F to be non-negative, which, after expansion and taking account of the stability condition, leads to:

$$g\delta < 1+x$$

providing $$g\delta \geq (1+x)/x$$

which for $\delta$ slightly less than 1 is approximately $$g \geq (1+x)/x$$

When a symmetrical circuit is desired for the differential stage of FIG. 3, then corresponding resistors R1 to R12 in the two paths are given the same resistances.

However, given the inaccuracies that exist on the real values of components, there may nevertheless subsist a degree of asymmetry between the contributions of output terminal A and of output terminal B in obtaining the differential output voltage $V_A - V_B$.

The effect of this inaccuracy can be minimized by taking F=0, i.e.

$$g\delta = (1+x)/x$$

which for $\delta$ close to 1 gives:

$$g = (1+x)/x$$

i.e. substantially:

$$R_{12}/R_{11} = R_{10}/R_9$$

The circuits described above are described as having voltages $v_a$ and $v_b$ applied to their inputs a and b. By putting $v = v_a - v_b$ and applying it to the non-inverting input of the path a-A and the inverting input of the path b-B, the behavior of these circuits remains unchanged. This modification avoids the need for an additional stage upstream for establishing the voltages $v_a$ and $v_b$.

These circuits may also be additionally provided with protective components (Transil transient suppressor, diode, thermistor, ...) in series with the resistances $r_a$ and $r_b$, thereby making it possible to obtain levels of protection equivalent to those obtained using transformer circuits.

Because of the symmetry of these circuits, the levels of protection are also identical in common mode and in differential mode.

In addition, if both output terminals are connected together and to ground, then the output voltages $v_{sA}$, and $v_{sB}$ from the two paths are limited, thereby putting a limit on the power delivered by the output amplifiers.

I claim:

1. A differential output stage for electronic equipment, the output stage comprising:
    a two-port network having two paths, each connecting an input terminal to an output terminal, wherein the stage comprises means for generating a negative feedback voltage from each path for applicating to the other, and means for providing an output voltage in each path equal to an identical linear combination in each path, of the input voltage to the path and of the negative feedback voltage from each path;
    wherein each of said paths includes first means for adding together the input voltage of the path under consideration with the negative feedback voltage from the other path, and second means for subtracting the output voltage from the path under consideration from the output voltage of the first means;
    wherein the output voltage of said second means constituting the negative feedback voltage from the path under consideration for applicating to the other path.

2. A differential stage according to claim 1 wherein the first means includes a first differential amplifier connected as an adder, and wherein the second means includes a second differential amplifier connected as a subtractor.

3. A differential stage according to claim 2, including, in each path, between the output from the first differential amplifier and the output from the path, additional means serving, when the output of the path is connected to ground, simultaneously to maintain the output voltage from said first differential amplifier unchanged and to obtain a very low output voltage from said additional means.

4. A differential stage according to claim 3, wherein said additional means includes means for adding the negative feedback voltage of the path in question for the other path to the output voltage of the first differential amplifier of the path in question.

5. A differential stage according to claim 4, wherein said means for adding the negative feedback voltage of the path under consideration for the other path to the output voltage of the first differential amplifier of the path in question comprises a third differential amplifier connected by means of a set of resistors $R_9$, $R_{10}$, $R_{11}$, and $R_{12}$ in such a manner as to satisfy the equation:

$$\frac{v'R_9 + v_R R_{10}}{R_9 + R_{10}} = v_s \frac{R_{11}}{R_{11} + R_{12}}$$

where $v_s$ designates the output voltage from said third differential amplifier, $v'$ designates the output voltage from said first differential amplifier on the path in question, and $v_R$ designates the negative feedback voltage of the path in question for the other path, with:

$R_9/R_{10} = 1 + \epsilon$ (with $0 < \epsilon < 1$) and $R_{12}/R_{11} = 1 - \epsilon'$ (with $0 \leq \epsilon' < < 1$).

6. A differential stage according to claim 5, wherein said first, second, and third differential amplifiers in the two paths are respectively identically connected in both paths, using resistors having the same nominal resistances in both paths, and said resistors $R_9$, $R_{10}$, $R_{11}$, $R_{12}$ in the two paths being selected in such a manner that the following relationship is substantially true:

$R_{12}/R_{11} = R_{10}/R_9$.

* * * * *